US006933242B1

(12) United States Patent
Srinivasan et al.

(10) Patent No.: US 6,933,242 B1
(45) Date of Patent: Aug. 23, 2005

(54) PLASMA ETCHING

(75) Inventors: Anand Srinivasan, Huddinge (SE);
Carl-Fredrik Carlstrom, Farsta (SE);
Gunnar Landgren, Sollentuna (SE)

(73) Assignee: Surface Technology Systems PLC, Gwent (GB)

( * ) Notice: Subject to any disclaimer, the term of this patent is extended or adjusted under 35 U.S.C. 154(b) by 211 days.

(21) Appl. No.: 10/018,809

(22) PCT Filed: Jun. 21, 2000

(86) PCT No.: PCT/GB00/02255

§ 371 (c)(1),
(2), (4) Date: Mar. 25, 2002

(87) PCT Pub. No.: WO00/79578

PCT Pub. Date: Dec. 28, 2000

(51) Int. Cl.[7] ............................................. H01L 21/302
(52) U.S. Cl. ...................... 438/714; 438/710; 438/718; 216/67; 216/75
(58) Field of Search ............................... 438/714, 718, 438/725, 728, 729, 732, 710; 216/67, 69, 216/71, 75

(56) References Cited

U.S. PATENT DOCUMENTS 5,527,425 A 6/1996 Hobson et al.
5,534,109 A 7/1996 Fujiwara et al.

FOREIGN PATENT DOCUMENTS

JP 11-16896 1/1999

OTHER PUBLICATIONS

C.F. Carlstrom, et al., "Trimethylamine: Novel source for low damage reactive ion beam etching of InP" Journal of Vacuum Science and Technology B, vol. 17, No. 6, Nov. 1999, pp. 2660-2663, XP002150318.
Elkind J L et al., "Reactive Ion Etching of HGCDTE with Methane and Hydrogren" Journal of Vacuum Science and Technology: Part A, US, American Institute of Physics, new Yrok, vo. 10, No. 4, PT I, Jul. 1, 1992, pp. 1106-1112, XP000296215 ISSSN: 0734-2101 p. 1106, left-hand column, line 12-line 14.

Primary Examiner—George A. Goudreau
(74) Attorney, Agent, or Firm—Volentine Francos & Whitt, PLLC

(57) ABSTRACT

A substrate whose elemental constituents are selected from Groups III and V of the Periodic Table, is provided with pre-defined masked regions. Etching of the substrate comprising the steps of: a) forming a gas containing molecules having at least one methyl group ($CH_3$) linked to nitrogen into a plasma; and b) etching the unmasked regions of the substrate by means of the plasma. For a substrate whose elemental constituents are selected from Groups II and VI of the Periodic Table, the plasma etching gas used is trimethylamine. Since the methyl compound of nitrogen has a lower bond energy than for hydrocarbon mixtures, free methyl radicals are easier to obtain and the gas is more efficient as a methyl source. In addition, compared with hydrocarbon mixtures, reduced polymer formation can be expected due to preferential formation of methyl radicals over polymer-generating hydrocarbon radicals because of the lower bond energy for the former.

21 Claims, 9 Drawing Sheets

A;
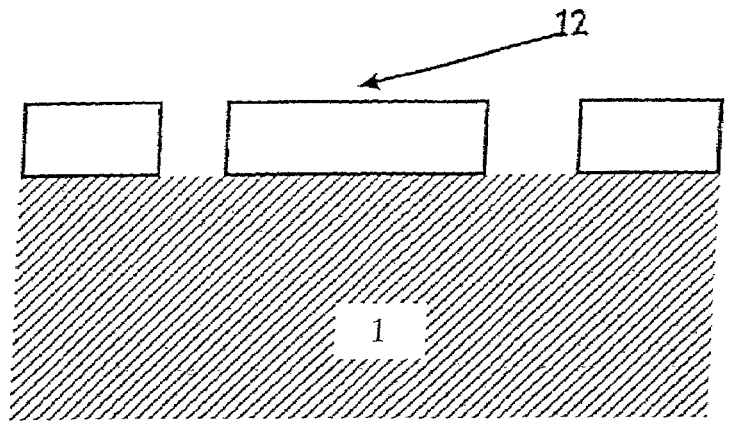
B;
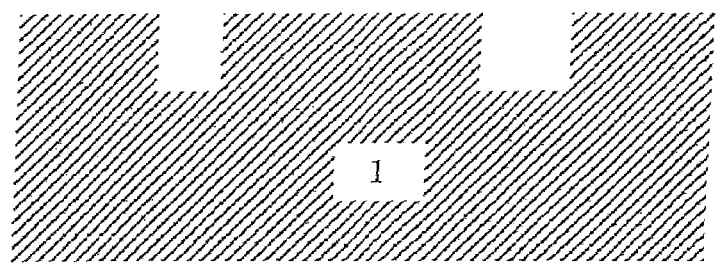
Fig. 7A-B

PLASMA ETCHING

The present invention relates to a method of etching and finds particular application in the fields of opto-electronic, electronic and micro-mechanical device production.

Many semiconductor devices consist of at least one element selected of Group III and at least one element selected of Group V of the periodic table (III–V materials). Examples of such materials include indium phosphide (InP), gallium arsenide (GaAs), the ternary ($In_xGa_{1-x}As$) and the quaternary materials ($In_xGA_{1-x}As_yP_{1-y}$).

The production of semiconductor devices generally involves the processing of the surface of a solid substrate, either by etching or by deposition. A known method of processing a solid substrate is to expose the substrate to a plasma of a gas having the glow discharges of the gas molecules reacting chemically and/or physically with the substrate.

III–V materials can be etched using hydrocarbon gases. In the book by Avishay Katz "Indium Phosphide and Related Materials, Processing, Technology and Devices", Artech House Boston, London, methods of etching InP and related materials are described.

It is considered in the above book that etching of the substrate surface is caused by formation of volatile organo-metal species (i.e. methyl-III compounds e.g. $(CH_3)_xIn$) and hydrogen-V compounds.

The formation of organometal species, especially $(CH_3)_xIn$, is crucial since the V-elements, especially phosphorus, are volatile and depletion of the group V-element on the surface can occur. The enrichment of III-elements, especially indium, leads to the micro-masking effect where indium rich areas are more difficult to etch and thereby mask the underlying crystal resulting in rough surface morphology.

However, increase of the hydrocarbon etch gas to compensate with a higher indium methyl formation rate leads to formation of an etch inhibiting polymer film on the surface and severe polymer build-up on the mask.

It is one object of the present invention to provide a method of etching with enhanced etching of the III elements, avoiding preferential etching of the V elements.

According to the present invention, there is provided a method of etching a substrate provided with pre-defined masked regions, whose elemental constituents are selected from Groups III and V of the Periodic Table, which method provides free methyl radicals in a plasma environment using a gas including a methyl compound bonded to nitrogen.

In particular, methylamine ($CH_3NH_2$), dimethylamine (($CH_3)_2NH$) and trimethylamine (($CH_3)_3N$) can be used as the etch gas. Preferred substrate materials comprise InN, InP, InAs, InSb, InGaAs, InGaAsP, GaN, GaP, GaAs, GaSb, AlP, AlAs, AlSb, AlGaAs, AlGaN and AlGaInN compounds.

Further, not only the above-mentioned materials, whose surface elemental constituents are selected from Groups III and V of the Periodic Table, can be etched, but also materials whose surface elemental constituents are selected from Groups II and VI of the Periodic Table, with said etchant gas, but preferably using trimethylamine as the etchant gas. Preferred such materials comprise CdS, CdSe, CdTe, HgS, HgSe, HgTe, MgS, MgSe, MgTe, MnS, MnSe, MnTe, PbS, PbSe, PbTe, SnS, SnSe, SnTe, ZnS, ZnSe, ZnTe, CdHgTe and other alloys based on these compounds.

It may be preferred that the etch gas comprising a methyl compound bonded to nitrogen should be mixed with another gas. Such additional gas may comprise $H_2$, $N_2$, $O_2$, a rare gas (such as Ar) or a halogen-containing gas (such as $Cl_2$, $BCl_3$) or any combination of these.

It has been found that methods according to the embodiment of the present invention can reduce the disadvantage mentioned above in that a much smoother ion beam etched surface is produced.

Further, low polymer formation is expected due to preferential formation of methyl radicals over polymer-generating hydrocarbon radicals because of the lower bond energy for the former. This allows higher methyl containing gas-flows to counter the preferential etching of the V elements, while maintaining a low polymer formation, which increases the parameter space useful for process optimisation.

Furthermore, it is possible to apply plasma etching other than ion beam etching, in which is used the above-mentioned etching gas that has been formed into a plasma, by supplying microwave electric power with a magnetic field, supplying microwave electric power alone, supplying radio frequency electric power or supplying DC-power. This application leads to enhanced etching of the III element in a III/V compound material to counter preferential removal of the V element.

The invention may be performed in various ways and preferred embodiments thereof will now be described, by way of example, with reference to the accompanying drawings, in which:

FIG. 7A is a cross sectional view showing an InP sample with resist mask;

FIG. 7B is a cross sectional view showing an etched InP sample after removal of the resist mark;

Table 1 shows, by atomic force microscopy, the measured root mean square (rms.) roughness of InP surfaces etched using different energies. The first two columns show rms. roughness of InP surfaces etched by etching methods according to an embodiment of the present invention. The last column shows the rms. roughness of InP surfaces etched by standard Ar sputtering.

A method for etching an InP substrate according to the embodiment of the present invention will now be described with reference to the drawings.

(1) Description of an inductively coupled radio-frequency plasma (ICP) ion beam etching system used in a method for etching an InP substrate according to an embodiment of the present invention.

Figure 1:
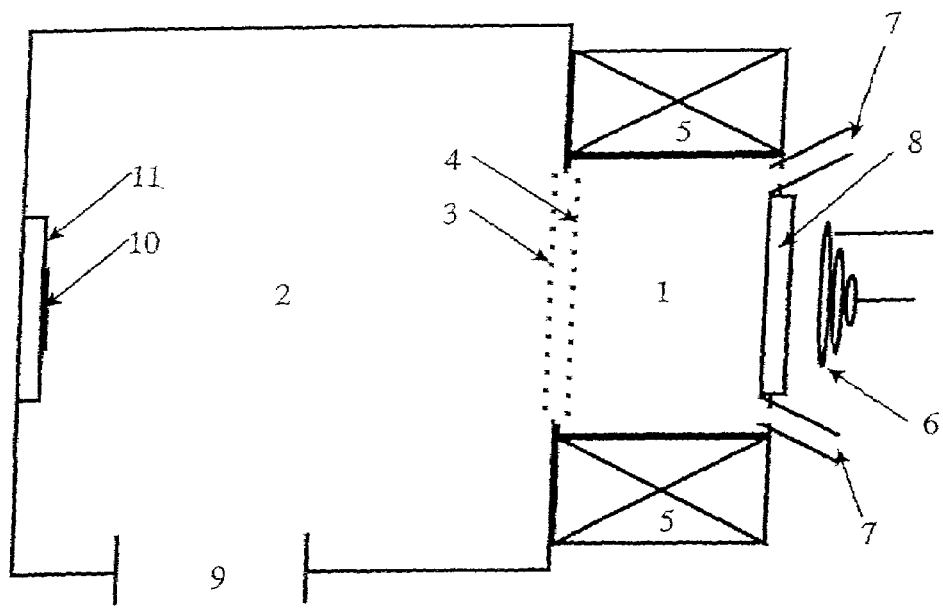
FIG. 1 is a side view showing a structure of an inductively coupled plasma ion beam etching apparatus used in an etching method according to an embodiment of the present invention.

In FIG. 1, a plasma generating chamber 1 is used for forming plasma. The plasma is generated by inductive coupling of 13.56 MHz RF-power from a coil 6 to the plasma generating chamber 1. The RF-power is coupled from the coil 6 to the plasma generating chamber 1 through a dielectric coupling window 8 which isolates the vacuum in the plasma generating chamber 1 from the atmospheric pressure at the coil 6. An etching chamber 2 is connected to the plasma generating chamber 1 through an extracting grid 3 and an acceleration grid 4. Ions in the plasma generated in the plasma generating chamber 1 are accelerated towards an InP substrate 10 by applying a negative bias on the extraction grid 3 and a positive bias on the acceleration grid 4. The InP substrate 10 is placed on the substrate table 11 which is grounded with respect to the extraction grid 3 and the acceleration grid 4.

Permanent magnets 5 enhance the RF-power coupling from coil 6 to the gas plasma in the plasma generating chamber. The gas is injected to the plasma generating chamber 1 through the gas introduction holes 7. An exhaust port 9 is provided from the etching chamber 2, and excessive etching gas and reacted gas are exhausted therethrough to the outside of the etching chamber.

This inductively coupled radio frequency plasma ion beam etching system has such features that the energy of the ions impinging on the target can be controlled in the range from a few eV up to 900 eV. Further, there is also the feature that etching can be made without significant heating of the substrate i.e. close to room temperature.

When the InP substrate 10 is etched, it is placed first on the substrate table 11. Then, trimethylamine $((CH_3)_3N)$ gas is introduced into the plasma generating chamber 1 through the gas introduction holes 7, and the RF-power is introduced into the plasma generating chamber 1 by inductive coupling from the coil 6 forming a plasma. Positive ion species from the plasma are accelerated towards the InP substrate 10 by the voltage obtained between the extraction grid 3 and the acceleration grid 4 by the applied grid biases. The ion energy of the ions impinging on the InP substrate 10 is determined by the bias applied to the acceleration grid 4 due to grounding of the substrate table 11. The impinging ions etch the InP substrate 10.

Figure 2:
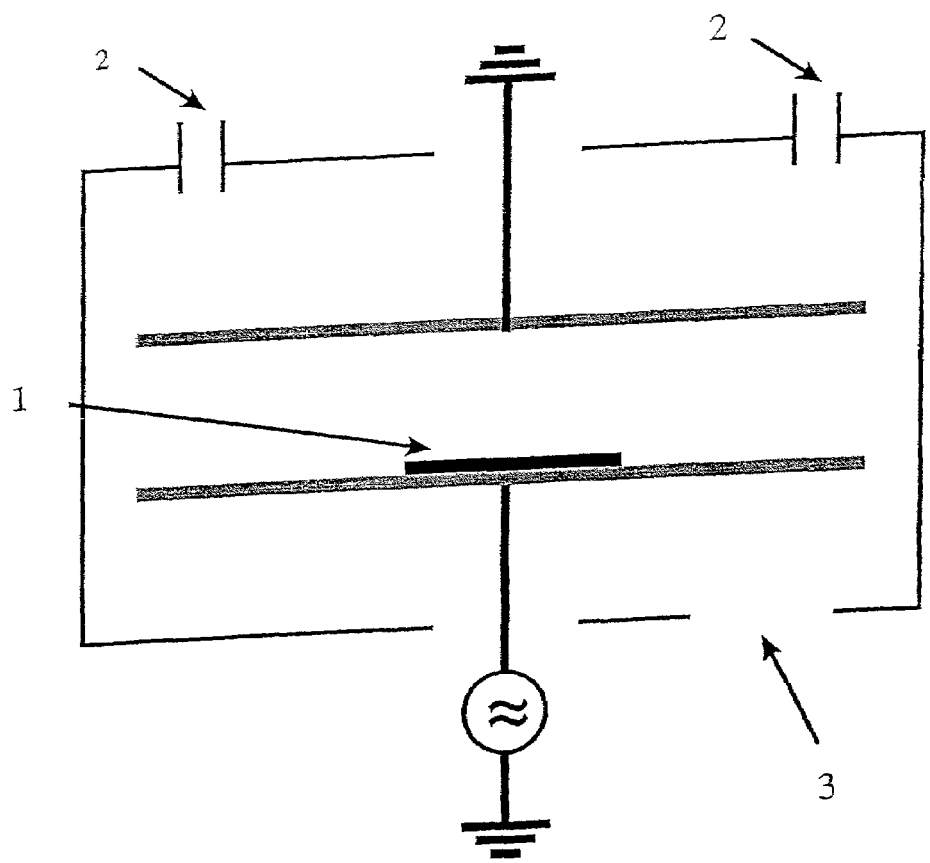
FIG. 2 is a side view showing a structure of a parallel plate type plasma etching apparatus used in an etching method according to an embodiment of the present invention.

A parallel plate type etching apparatus such as shown in FIG. 2, rather than the ion beam etching apparatus, may also be used. In this parallel type etching apparatus RF electric power having frequency of 13.56 MHz is supplied between the opposed electrodes, thereby forming the etching gas in an etching chamber into plasma so as to etch a substrate 1. The chamber has gas inlets 2 and a gas exhaust 3.

Figure 9:
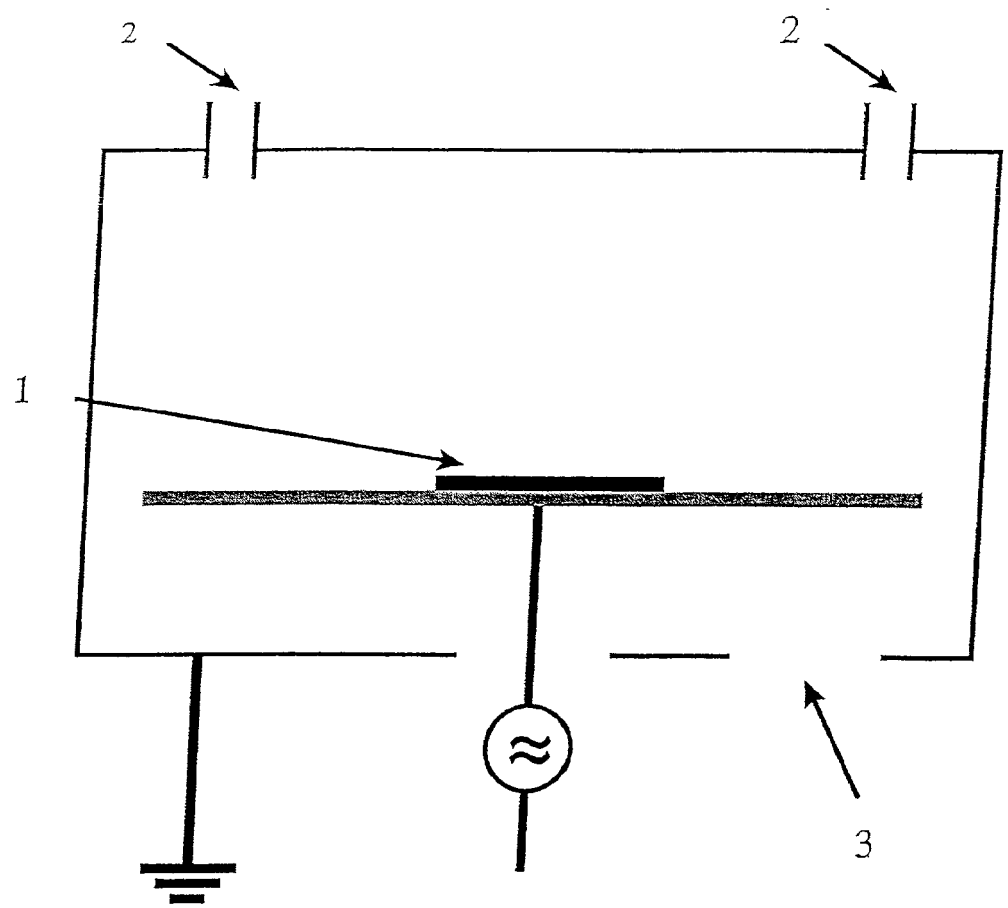
FIG. 9 is a side view showing a structure of a diode type plasma etching apparatus used in an etching method according to an embodiment of the present invention.

In a diode type etching apparatus as shown in FIG. 9, RF electric power having a frequency of 13.56 MHz is supplied to the electrode, on which a substrate 1 is situated, thereby forming the etching gas in an etching chamber into plasma so as to etch a substrate. The walls of the chamber are grounded. The chamber has gas inlets 2 and a gas exhaust 3.

Figure 3:
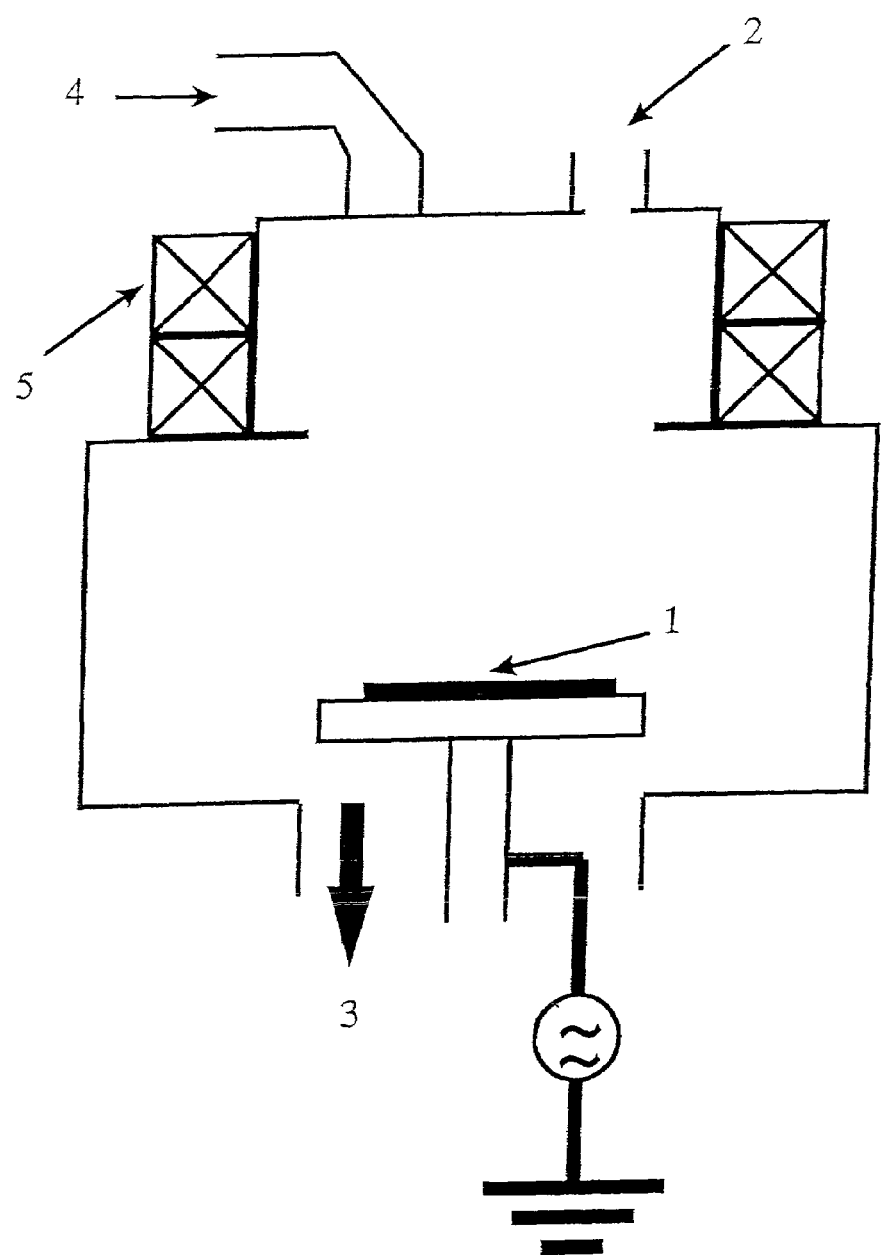
FIG. 3 is a side view showing a structure of an electron cyclotron resonance (ECR) etching apparatus used in an etching method according to an embodiment of the present invention.

In the ECR etching apparatus of FIG. 3, the chamber has a gas inlet 2 and a gas exhaust 3 and a mounting for a substrate 1. Microwave input is provided at 4 and magnets 5 are used to enhance the power coupling.

Figure 4:
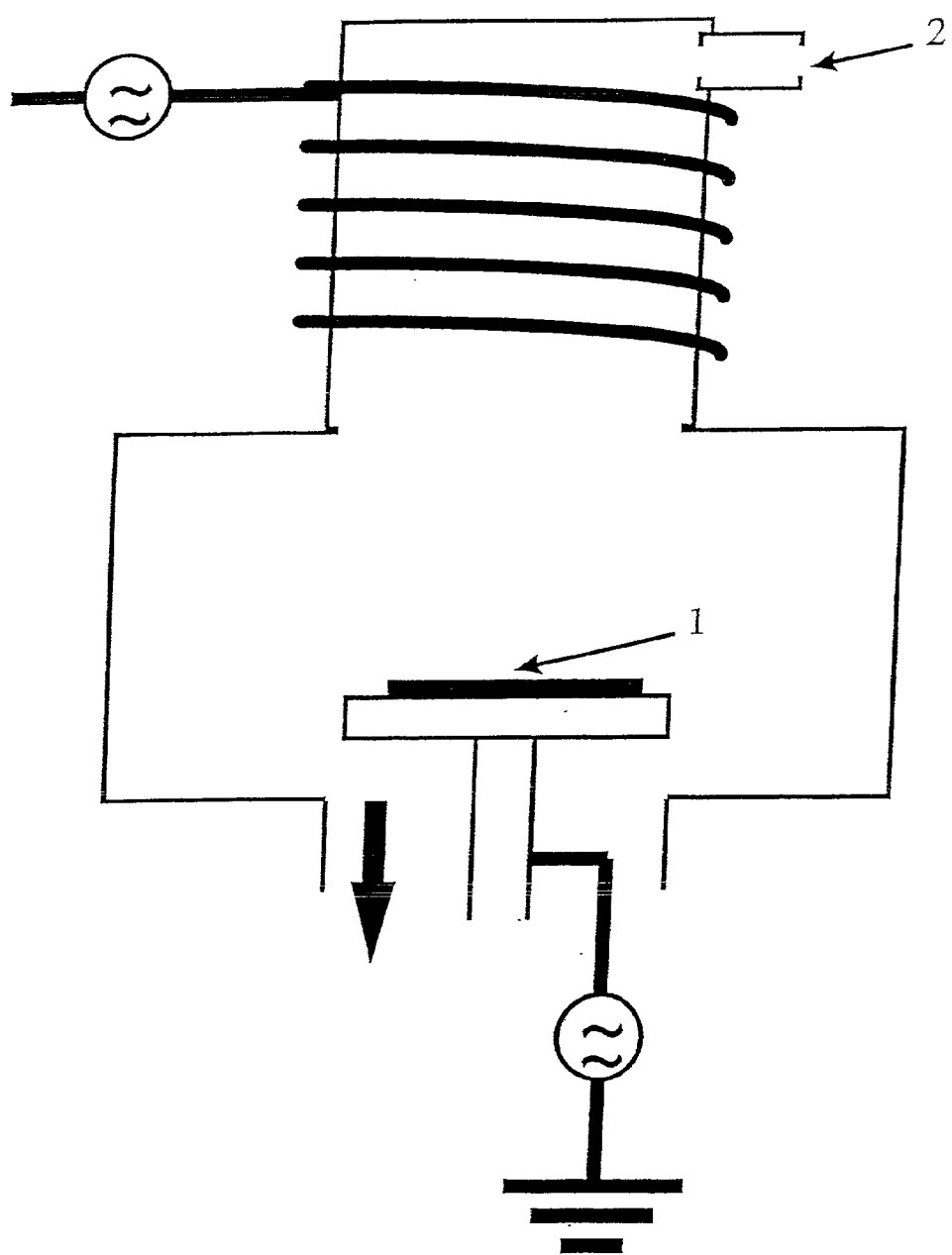
FIG. 4 is a side view showing a structure of an inductively coupled plasma (ICP) etching apparatus used in an etching method according to an embodiment of the present invention.

In the (ICP) type etching apparatus of FIG. 4, again the chamber supports a substrate 1 and has a gas inlet 2 and a gas exhaust 3.

Figure 5:
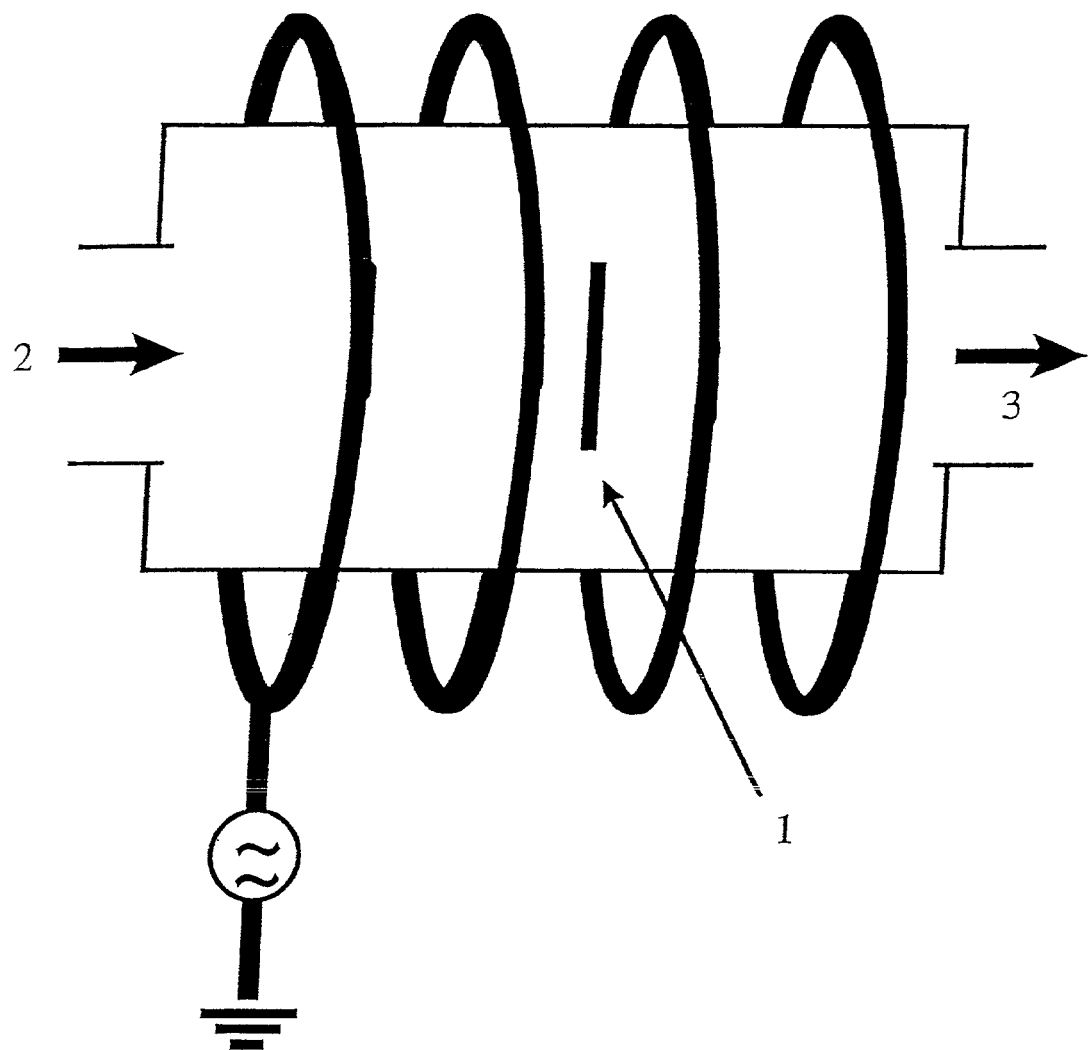
FIG. 5 is a side view showing a structure of a barrel reactor plasma etching apparatus used in an etching method according to an embodiment of the present invention.

The barrel reactor etching apparatus of FIG. 5 has a gas inlet 2 and a gas exhaust 3 and supports the substrate 1 as shown.

Figure 6:
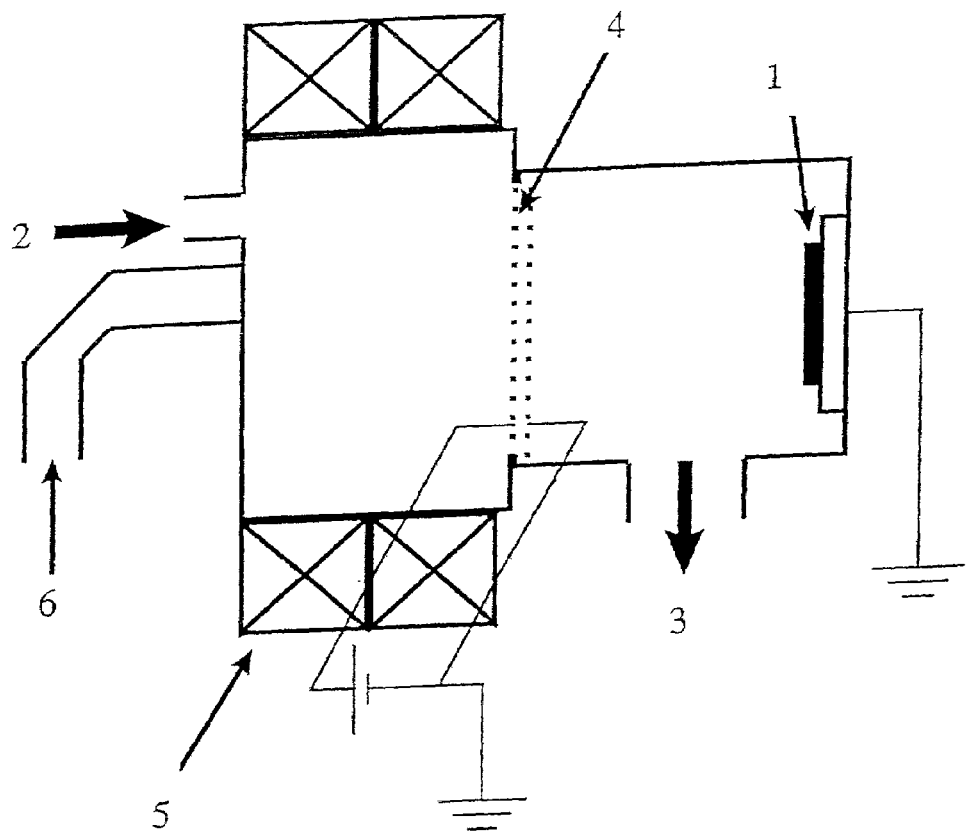
FIG. 6 is a side view showing a structure of an electron cyclotron resonance plasma ion beam etching apparatus used in an etching method according to an embodiment of the present invention.

Further, an ion beam etching apparatus having any type of plasma source, and in particular an ECR plasma source such as shown in FIG. 6 or an ICP source such as shown in FIG. 1, may also be used. In FIG. 6 the substrate is carried at 1 and the chamber has a gas inlet 2 and a gas exhaust 3. Voltage grids are provided, together with a magnet 5 used to enhance the power coupling and a microwave input 6.

Although the following detailed description refers to the use of an Ion Beam Etching apparatus, other types of high and low density plasma tools which are well known to those skilled in the art (including those outlined above) can also be used.

(2) Description of a method for etching an InP substrate according to an embodiment of the present invention.

First, a resist is coated onto the InP substrate by a spin coating method. Then the coated resist is hardened by baking so as to form a resist film having a thickness 1.2 $\mu$m. Then, the resist film is exposed selectively using a photo mask, and thereafter unnecessary portions are removed by soaking the substrate into a developer, thus completing a resist mask 12 having openings as shown in FIG. 7A. In FIG. 7A the substrate 1 is shown with a completed resist mask 12.

Next, using the inductively coupled plasma ion beam etching apparatus as shown in FIG. 1, the InP substrate 10 with the resist mask is placed on the substrate table 11 in the etching chamber 2. Then, the interior of the etching chamber 2 and the interior of the plasma generating chamber 1 are exhausted.

After a predetermined base pressure is reached, trimethylamine gas is introduced into the plasma generating chamber 1 and the pressure is held at $1.0 \times 10^{-4}$ Torr to $6.0 \times 10^{-4}$ Torr by varying the gas flow due to constant pumping speed. In case of the present embodiment, the pressure is held at $2.0 \times 10^{-4}$ Torr and the trimethylamine gas flow is held, for instance, at 3 sccm. Furthermore, RF-power of 170 W is introduced to the plasma generating chamber 1. With this, the trimethylamine is formed into a plasma through inductively coupling of the RF-power. The plasma gas passes through the acceleration grid 4 and the extraction grid 3 into the etching chamber 2 and the ionised species are accelerated towards the InP substrate 10, impinging and thus starting etching. In other high density embodiments, the acceleration of the ionised species is achieved by means of applying an electrical bias, means of application being well known to those skilled in the art. This acceleration bias plays a critical role during the etching process. After etching, the resist mask is removed by acetone as shown on FIG. 7B. Any remaining resist residuals are removed by oxygen plasma treatment.

(3) Next the results of the above etching will be described.

Figure 8:
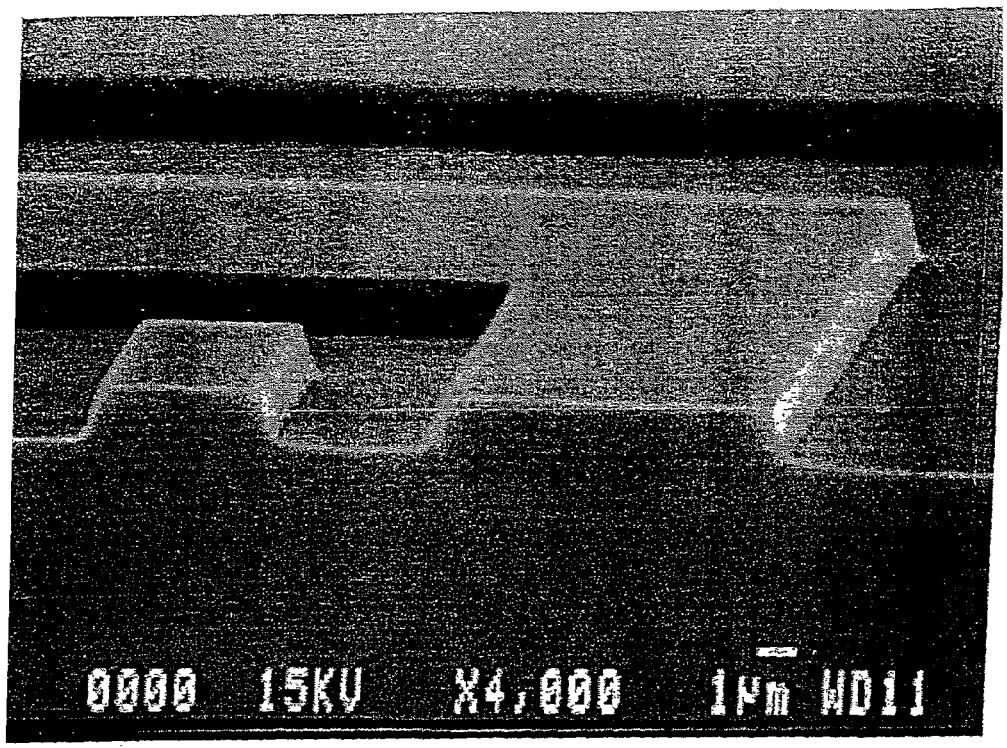
FIG. 8 is scanning electron microscopy picture showing test structures in InP after etching based on an etching method according to an embodiment of the present invention.

FIG. 8 shows a scanning electron microscopy picture of an etched test structure in InP after etching for 30 min having a trimethylamine flow of 3 sccm and a pressure at $2.0 \times 10^{-4}$ Torr. The biases on the extraction grid 3 and the acceleration grid 4 were kept at −300 V and +300 V respectively with respect to the grounded substrate table 11.

Table 1 shows the rms. roughness of etched InP surfaces measured by atomic force microscopy. The etch depths are in all cases 200 nm.

Column 1 in table 1 shows the rms. roughness of InP surfaces etched using trimethylamine (TMA) gas as described above for different energies of the impinging ions. Only the acceleration grid voltage and the process time were varied while all other parameters were kept constant.

Column 2 in table 1 shows a diagram of the rms. roughness of InP surfaces etched as described above, but with a mixture of trimethylamine (TMA) and Ar gas at different energies of the impinging ions. Only the acceleration grid voltage and process time were varied while all other parameters were kept constant. The etching was performed under similar conditions as those demonstrated in column 1 in table 1 and in the same etching apparatus. Gas flows of trimethylamine and Ar were 3 sccm and 5 sccm respectively.

Column 3 in table 1 shows a diagram of the rms. roughness of InP surfaces etched using standard Ar sputtering with different ion energies of the impinging ions. Only the acceleration grid voltage and process time were varied while all other parameters were kept constant. The etching was performed under similar conditions as those demonstrated in column 1 in table 1 and in the same etching apparatus. Ar gas flow was 5 sccm.

From the result of the atomic force microscopy observation, it is seen that the trimethylamine based process can produce extremely smooth morphologies (i.e. low rms. roughness) compared to standard Ar milling. Thus by using an etching method of an embodiment of the present invention, it is possible to obtain extremely smooth etched InP surface morphologies.

TABLE 1

| ION ENERGY | PROCESS GAS | | |
| --- | --- | --- | --- |
| | TMA | TMA + Ar | Ar |
| 75 eV | 0.65 nm | 0.15 nm | 4.80 nm |
| 150 eV | 0.16 nm | 0.19 nm | 3.90 nm |
| 300 eV | 0.26 nm | 0.24 nm | 13.70 nm |
| 500 eV | 0.39 nm | 1.1 nm | 7.30 mn |

What is claimed is:

1. A method of etching a substrate provided with predefined masked regions, whose elemental constituents are selected from Groups III and V of the Periodic Table, comprising the steps of: a) forming a gas containing molecules having at least one methyl group ($CH_3$) linked to nitrogen into a plasma; and b) etching the unmasked regions of the substrate by means of the plasma such that etching of the group III materials is enhanced, thereby reducing the effect of preferential etching of the group V materials in groups III–V compounds.

2. The method according to claim 1, wherein said etching gas is selected from the group consisting of methylamine ($CH_3NH_2$), dimethylamine (($CH_3$)$_2$NH) and trimethylamine (($CH_3$)$_3$N).

3. A method of etching a substrate provided with predefined masked regions, whose elemental constituents are selected from Groups II and VI of the Periodic Table, comprising the steps of: a) forming an etching gas comprising trimethylamine (($CH_3$)$_3$N) into a plasma; and b) etching the unmasked regions of the substrate by means of the plasma such that etching of the group II materials is enhanced, thereby reducing the effect of preferential etching of the group VI materials in groups II–VI compounds.

4. The method according to claim 1, wherein said etching gas is mixed with another gas selected from the group consisting of a rare gas, a halogen-containing gas, or a combination thereof.

5. A method according to claim 1, wherein said step (a) comprises forming the gas into a plasma by supplying microwave electric power with a magnetic field to the etching gas.

6. A method according to claim 1, wherein said step (a) comprises forming the gas into a plasma by supplying microwave electric power to the etching gas.

7. A method according to claim 1, wherein said step (a) comprises forming the gas into a plasma by supplying radio frequency electric power to the etching gas.

8. A method according to claim 1, wherein said step (a) comprises forming the gas into a plasma by supplying DC electric power to the etching gas.

9. A method according to claim 1, wherein the ions are accelerated by a DC bias.

10. A method according to claim 9, wherein said DC bias creates energy in the range of 0–2000 eV.

11. A method according to claim 1, wherein the applied power is converted to an ion energy in the range of 0–2000 eV.

12. The method according to claim 3, wherein said etching gas is mixed with another gas selected from the group consisting of a rare gas, a halogen-containing gas, or a combination thereof.

13. A method according to claim 3, wherein said step (a) comprises forming the gas into a plasma by supplying microwave electric power with a magnetic filed to the etching gas.

14. A method according to claim 3, wherein said step (a) comprises forming the gas into a plasma by supplying microwave electric power to the etching gas.

15. A method according to claim 3, wherein said step (a) comprises forming the gas into a plasma by supplying radio frequency electric power to the etching gas.

16. A method according to claim 3, wherein said step (a) comprises forming the gas into a plasma by supplying DC electric power to the etching gas.

17. A method according to claim 3, wherein the ions are accelerated by a DC bias.

18. A method according to claim 17, wherein said DC bias creates energy in the range of 0–2000 eV.

19. A method according to claim 1, wherein the applied power is converted to an ion energy in the range of 0–2000 eV.

20. The method according to claim 4, wherein said rare gas is selected from the group consisting of a $H_2$, $N_2$, $O_2$, Ar or a combination thereof, and said halogen-containing gas is selected from the group consisting of $Cl_2$, $BCl_3$ or a combination thereof.

21. The method according to claim 12, wherein said rare gas is selected from the group consisting of a $H_2$, $N_2$, $O_2$, Ar or a combination thereof, and said halogen-containing gas is selected from the group consisting of $Cl_2$, $BCl_3$ or a combination thereof.

* * * * *